(12) United States Patent
Palm et al.

(10) Patent No.: US 8,631,566 B2
(45) Date of Patent: Jan. 21, 2014

(54) CIRCUIT BOARD STRUCTURE COMPRISING AN ELECTRICAL COMPONENT AND A METHOD FOR MANUFACTURING A CIRCUIT BOARD STRUCTURE COMPRISING AN ELECTRICAL COMPONENT

(75) Inventors: Petteri Palm, Espoo (FI); Tuomas Waris, Espoo (FI)

(73) Assignee: Imbera Electronics Oy, Espoo (FI)

( * ) Notice: Subject to any disclaimer, the term of this patent is extended or adjusted under 35 U.S.C. 154(b) by 731 days.

(21) Appl. No.: 12/546,454

(22) Filed: Aug. 24, 2009

(65) Prior Publication Data

US 2010/0046186 A1  Feb. 25, 2010

(30) Foreign Application Priority Data

Aug. 25, 2008  (FI) ..................................... 20085790

(51) Int. Cl.
*H05K 3/30* (2006.01)
*H01R 43/00* (2006.01)

(52) U.S. Cl.
USPC ................................ 29/841; 29/825; 29/832

(58) Field of Classification Search
USPC ............ 29/841, 825, 831, 832, 834; 174/250, 174/251, 255
See application file for complete search history.

(56) References Cited

U.S. PATENT DOCUMENTS

| | | | | |
|---|---|---|---|---|
| 3,650,648 A * | 3/1972 | Lambrecht | ................ | 425/129.1 |
| 3,739,438 A * | 6/1973 | Lambrecht | .................... | 29/25.42 |
| 5,192,682 A * | 3/1993 | Kodai et al. | ...................... | 29/841 |
| 5,353,498 A * | 10/1994 | Fillion et al. | ..................... | 29/840 |
| 5,497,033 A * | 3/1996 | Fillion et al. | ................... | 257/723 |
| 5,617,297 A * | 4/1997 | Lo et al. | ........................ | 361/737 |
| 5,668,405 A * | 9/1997 | Yamashita | .................... | 257/668 |
| 5,866,952 A * | 2/1999 | Wojnarowski et al. | ........ | 257/788 |
| 5,892,271 A * | 4/1999 | Takeda et al. | .................. | 257/668 |
| 5,999,413 A * | 12/1999 | Ohuchi et al. | ................. | 361/772 |
| 6,023,096 A * | 2/2000 | Hotta et al. | ..................... | 257/687 |
| 6,060,771 A * | 5/2000 | Tomikawa et al. | ............. | 257/676 |
| 6,774,467 B2* | 8/2004 | Horiuchi et al. | ............... | 257/673 |
| 8,017,449 B2* | 9/2011 | Cheng et al. | ................... | 438/126 |
| 2002/0149027 A1* | 10/2002 | Takahashi et al. | ............. | 257/100 |
| 2006/0090334 A1* | 5/2006 | Chen et al. | ...................... | 29/858 |
| 2008/0029865 A1* | 2/2008 | Bauer et al. | .................... | 257/684 |

FOREIGN PATENT DOCUMENTS

| | | |
|---|---|---|
| DE | 198 45 665 A1 | 4/2000 |
| FR | 2 822 338 | 9/2002 |
| JP | 2005-311267 | 11/2005 |

* cited by examiner

*Primary Examiner* — David Angwin
(74) *Attorney, Agent, or Firm* — Merchant & Gould P.C.

(57) ABSTRACT

A method for manufacturing a circuit board structure comprising at least one electrical component. The method comprises the steps of fabricating a conductive pattern on the surface of an essentially plane-like layer on the back side of the plane-like layer, and forming an electrical contact between the at least one electrical component and the conductive pattern. The method further comprises the steps of attaching the at least one electrical component to the back side of the plane-like layer after the fabrication of the conductive pattern, molding encapsulation material on the back side of the plane-like layer so that the encapsulation material at least partly encloses the at least one electrical component attached to the back side of the plane-like layer, and forming holes through the conductive pattern at positions where terminals of the at least one electrical component is attached to the back side of the plane-like layer and become positioned when the at least one electrical component is attached to the circuit board structure.

5 Claims, 8 Drawing Sheets

CIRCUIT BOARD STRUCTURE COMPRISING AN ELECTRICAL COMPONENT AND A METHOD FOR MANUFACTURING A CIRCUIT BOARD STRUCTURE COMPRISING AN ELECTRICAL COMPONENT

This application claims benefit of Serial No. 20085790, filed 25 Aug. 2008 in Finland and which application(s) are incorporated herein by reference. To the extent appropriate, a claim of priority is made to each of the above disclosed applications.

TECHNICAL FIELD

The invention relates to electronics packaging technology. Particularly, the invention relates to a circuit board structure and a method for manufacturing a circuit board and for encapsulating an electrical component on the circuit board.

BACKGROUND OF THE INVENTION

The development of circuit board manufacturing methods and packaging methods aims at, among other things, a denser layout of electrical components on the circuit board, a thinner circuit board structure, and improving the mechanical, electrical, and thermal properties of the circuit board. A further key issue is the improvement of the yield and reliability of the manufacturing process.

Patent specification U.S. Pat. No. 5,192,682 discloses a method for manufacturing a thin packaged semiconductor component entity. The method comprises molding an integrated circuit within an encapsulation material to protect the circuit and to attach it to an external structure. According to the specification, the method facilitates the placing of the integrated circuit in an external structure.

Patent application publication US 2006/0090334 discloses a method for manufacturing memory cards. The disclosed method comprises packaging integrated components contained in the memory card and molding them into a mold in larger component groups using a single mold. According to the application, using a single mold speeds up the manufacturing of memory cards and reduces the manufacturing costs.

In both of the documents mentioned, U.S. Pat. No. 5,192,682 and US 2006/0090334, an integrated circuit or a component is wire-bonded to a conductive pattern. As in the methods and circuit board structures in accordance with the publications U.S. Pat. No. 5,192,682 and US 2006/0090334, electrical components are connected to the conductive pattern through wire bonds, the electrical contact between the component and the conductive pattern, susceptible to disturbances, is exposed to the environment. Such mutual positioning of wire bonds, components and the conductive pattern makes an encapsulation of the integrated circuit more difficult and increases the risk of the conductive pattern and the electrical contacts (wire bonds) between the component terminals and the conductive pattern becoming damaged, e.g., during encapsulation or other phases of the circuit board manufacturing process. This deteriorates the reliability and stability of the manufacturing process and the circuit board structure.

PURPOSE OF THE INVENTION

It is a purpose of the invention to eliminate the problems related to prior art mentioned above and to introduce a novel circuit board structure comprising an electrical component and a method for manufacturing the structure.

SUMMARY OF THE INVENTION

The method in accordance with the invention is defined by the independent claim 1 or the independent claim 9.

The circuit board structure in accordance with the invention is defined by the independent claim 6 or the independent claim 8.

The method for manufacturing a circuit board structure comprising an electrical component in accordance with the invention comprises the steps of fabricating a conductive pattern on the surface of an essentially plane-like layer on the back side of the plane-like layer, and forming an electrical contact between at least one electrical component and the conductive pattern. The method further comprises the steps of attaching at least one electrical component on the back side of the plane-like layer after the fabrication of the conductive pattern so that terminals below the electrical component become positioned against the conductive pattern fabricated on the back side of the plane-like layer, molding encapsulation material on the back side of the plane-like layer so that the encapsulation material at least partly encloses the at least one electrical component attached to the back side of the plane-like layer and that the front side of the plane-like layer remains free of the encapsulation material at least for those parts where an electrical component is attached to the plane-like layer on the back side of the plane-like layer, and forming holes through the conductive pattern at positions where the terminals of the electrical components become positioned when the electrical component is attached to the circuit board structure in order to form a conduit from the terminal through the conductive pattern.

Alternatively, the method for manufacturing a circuit board structure comprising an electrical component in accordance with the invention comprises the steps of fabricating a conductive pattern on the surface of an essentially plane-like layer on the front side of the plane-like layer, and forming an electrical contact between at least one electrical component and the conductive pattern. In this case, the method further comprises the steps of forming holes through the plane-like layer at positions where terminals of the electrical components are placed when the electrical component is attached to the circuit board structure, attaching at least one electrical component to the back side of the plane-like layer after forming the holes so that the terminals below the electrical component are positioned at the holes, molding encapsulation material on the back side of the plane-line layer so that the encapsulation material at least partly encloses the at least one electrical component attached to the back side of the plane-like layer and that the front side of the plane-like layer remains free of the encapsulation material at least for those parts where an electrical component is attached to the plane-like layer on the back side of the plane-like layer. This method comprises fabricating a conductive pattern on the front side of the plane-like layer after molding the encapsulation material on the back side of the plane-like layer.

The circuit board structure in accordance with the invention comprises an essentially plane-like layer, a conductive pattern on the back side of the plane-like layer, and at least one electrical component, including its terminals, in electrical contact with the conductive pattern. Furthermore, the circuit board structure comprises holes penetrating through the plane-line layer and the conductive pattern in order to form a conduit from the front side of the plane-like layer through the conductive pattern to the terminal, encapsulation material only on the back side of the plane-like layer, the encapsulation material at least partly enclosing the at least one electrical component, the at least one electrical component being connected to the back side of the plane-like layer so that the terminals of the electrical component are against the conductive pattern formed on the plane-like layer below the electrical component.

Alternatively, the circuit board structure comprising an electrical component in accordance with the invention comprises a conductive pattern, at least one electrical component in electrical contact with the conductive pattern, and encapsulation material, the encapsulation material at least partly enclosing the at least one electrical component. The at least one electrical component is connected to the conductive pattern so that terminals of the electrical component are against the conductive pattern below the electrical component and the encapsulation material also at least partly encloses the conductive pattern, the circuit board structure comprising holes penetrating through the conductive pattern below the terminals, forming a conduit through the conductive pattern, and being filled with conductive material in order to form an electrical contact between the terminals and the conductive pattern.

As used in this document, the expression "electrical component" may mean any component using the movement of charge carriers between the conductive pattern and the component in its operation, or any active or passive component in part or entirely operating electrically or being in part or entirely controlled electrically. By way of example, components meant by the expression "electrical component" as used in this document include resistors, coils, capacitors and MEMS (micro-electro-mechanical system) components, and various optoelectronic components, such as light emitting diodes (LEDs), detectors (e.g. photodiodes), solar cells, MOEMS (micro-opto-electromechanical system) components, and lasers. However, the expression "electrical component" is not in any way limited to relate to these examples.

As used in this document, the expression "back side of the plane-like layer" or "front side of the plane-like layer" or corresponding expressions should be understood, unless otherwise stated, as meaning the region at the back side of the plane-like layer or the region at the front side of the plane-like layer, respectively, and not only the surface of the plane-like layer.

The method in accordance with the invention enables manufacturing thinner, thermally more stable, and more reliable electronic circuits compared with prior art and, furthermore, achieving an extremely high density of the electrical components on the circuit board. The "fan-in" and "fan-out" figures of logical circuits manufactured using the method can also be increased, whereby the connectivity of the circuits is improved.

The encapsulation material used in the method may be, e.g., a conventional epoxy material used for the packaging of electrical components, another polymer, or an optical epoxy, which may be used for the packaging of, e.g., optoelectronic or other components in optical contact with their environment. An optical and mechanical (e.g. for MEMS components) connection between a packaged component and the environment can also be achieved by partial encapsulation. Molding protection (encapsulation) can be provided, e.g., by using a vacuum printing process or transfer molding. As the method in accordance with the invention comprises molding the electrical components within the encapsulation material, the circuit board structure need not be exposed to high pressure at the molding step of the method, which improves the reliability of the manufacturing method and enables the use of simpler manufacturing apparatuses.

In accordance with the invention, the terminals of the electrical component are located essentially below the component. Thereby, when the electrical component is attached to the circuit board, a connection point is formed between the conductive pattern and the electrical component on the surface of the plane-like layer or the conductive pattern below the component, e.g., an integrated circuit. Therefore, electrical contacts susceptible to disturbances are well shielded and will not easily come into contact with the encapsulation material during encapsulation, for example, while the component shades the connection point, whereby the stability of the electrical contacts is improved. As a result of this, among other things, the method is more flexible than prior art methods with regard to different encapsulation materials and materials used for the conductive pattern. In addition, the method in accordance with the invention enables a packaged circuit board structure comprising an electrical component free of wire bonds susceptible to disturbances. The method in accordance with the invention is well suited to the manufacturing of, e.g., QFN (Quad Flat no Leads), BGA (Ball Grid Array), or various WLP (Wafer Level Packaged) components or component packages.

As the method in accordance with the invention comprises fabricating holes at the positions of the terminals of the electrical component so that the holes form a connecting conduit between the terminal of the electrical component on the back side of the plane-like layer and the front side of the plane-like layer, the final electrical contact between the terminal of the electrical component and the conductive pattern may be formed after the electrical components have been encapsulated in the circuit board structure. Therefore, it is possible to minimize any thermal and mechanical stresses on the electrical contact between the electrical component and the conductive pattern potentially caused by the manufacturing process of the circuit board structure and, as a result, the electrical contacts become durable and reliable. This also improves the yield of the manufacturing process. Furthermore the holes enable the formation of the final electrical contact between the electrical component and the conductive pattern by deposition of conductive material into the holes. There exist many different conductive materials, e.g. metals, which are metallurgically compatible with the terminals of the electrical components and which can be deposited by known film deposition methods such as e.g. PVD, CVD, sputtering, ALD or PECVD. This way of fabricating the electrical contact facilitates the formation of a reliable, thermally and mechanically stable, metallurgic bond between the terminal of the electrical component and the conductive pattern, i.e. the wiring pattern, of the circuit board.

An embodiment of the invention comprises forming holes through a plane-like layer and a conductive pattern before attaching at least one electrical component to the back side of the plane-like layer after the fabrication of the conductive pattern, in order to form a conduit from the front side of the plane-like layer to the back side of the plane-like layer.

When the holes through the plane-like layer and/or the conductive pattern are formed before the electrical components are attached to the circuit board structure, the holes may be used for component alignment. Thereby, component terminals may be easily and accurately aligned with the holes in the plane-like layer, and any systematic errors in the positioning of the holes do not affect the position of the component terminals in relation to the holes. This enables more reliable electrical contacts between the component terminals and the conductive pattern. In addition, the components may be positioned in a denser fashion on the circuit board, and the pitch of the components becomes finer, which enables the manufacture of even complex circuits.

The manufacturability and yield of circuit boards manufactured using the method in accordance with the invention may also be improved because the conduits extending through the conductive pattern and/or the plane-like layer enable the fabrication of the conductive pattern in its entirety on the front side of the plane-like layer after the encapsulation step. This also enables reducing any thermal and/or mechanical stress potentially caused on the conductive pattern. When, in some embodiments of the invention, the molding of the encapsulation material, i.e., the molding protection or encapsulation of the electrical components, is performed on a side of the plane-like layer, e.g. the completed circuit board or the only partially completed circuit board, different from the side where the conductive pattern will be fabricated, the conductive pattern is not exposed to any thermal and/or mechanical stress caused by the encapsulation step, which increases the reliability of the manufacturing process.

An embodiment of the method in accordance with the invention comprises the step of partly covering the plane-like layer so that only those areas of the plane-like layer where an electrical component is attached as viewed from the back, together with their surroundings, can be exposed to the encapsulation material so that the encapsulation material cannot come into contact with the front side of the plane-like layer when molding the encapsulation material on the back side of the plane-like layer in order to enclose the at least one electrical component at least partly within the encapsulation material.

An embodiment of the method in accordance with the invention comprises the step of applying a binder agent to the back side of the plane-like layer so that the terminals below the electrical component essentially become located within the binder agent when the electrical component is attached to the circuit board structure. When the component terminals are encapsulated within the binder agent used for bonding, e.g. epoxy, electrical contact areas between the component and the conductive pattern, susceptible to disturbances, can be effectively protected from the environment. This is particularly useful in other packaging phases of the circuit board.

In an embodiment of the method in accordance with the invention the plane-like layer comprises an etch stop layer for protecting the conductive pattern. The etch stop layer can be utilized to protect the conductive pattern and the contact regions below the terminals of the electrical components when structures below the etch stop layer on the front side of the plane-like layer (and possibly parts of the plane-like layer itself), are removed from the circuit board structure by e.g. chemical etching.

In an embodiment of the invention, the circuit board structure comprises a binder agent essentially located below the electrical component, essentially enclosing the terminals of the electrical component in order to protect the electrical contact between the electrical component and the conductive pattern.

The embodiments of the invention presented above can be combined with each other. Several embodiments can be combined to form a new embodiment. A method or product to which the invention relates may include one or more of the embodiments of the invention presented above.

DETAILED DESCRIPTION OF THE INVENTION

In the following, the invention is described by means of examples by reference to the following drawings, where.

Figure 1:
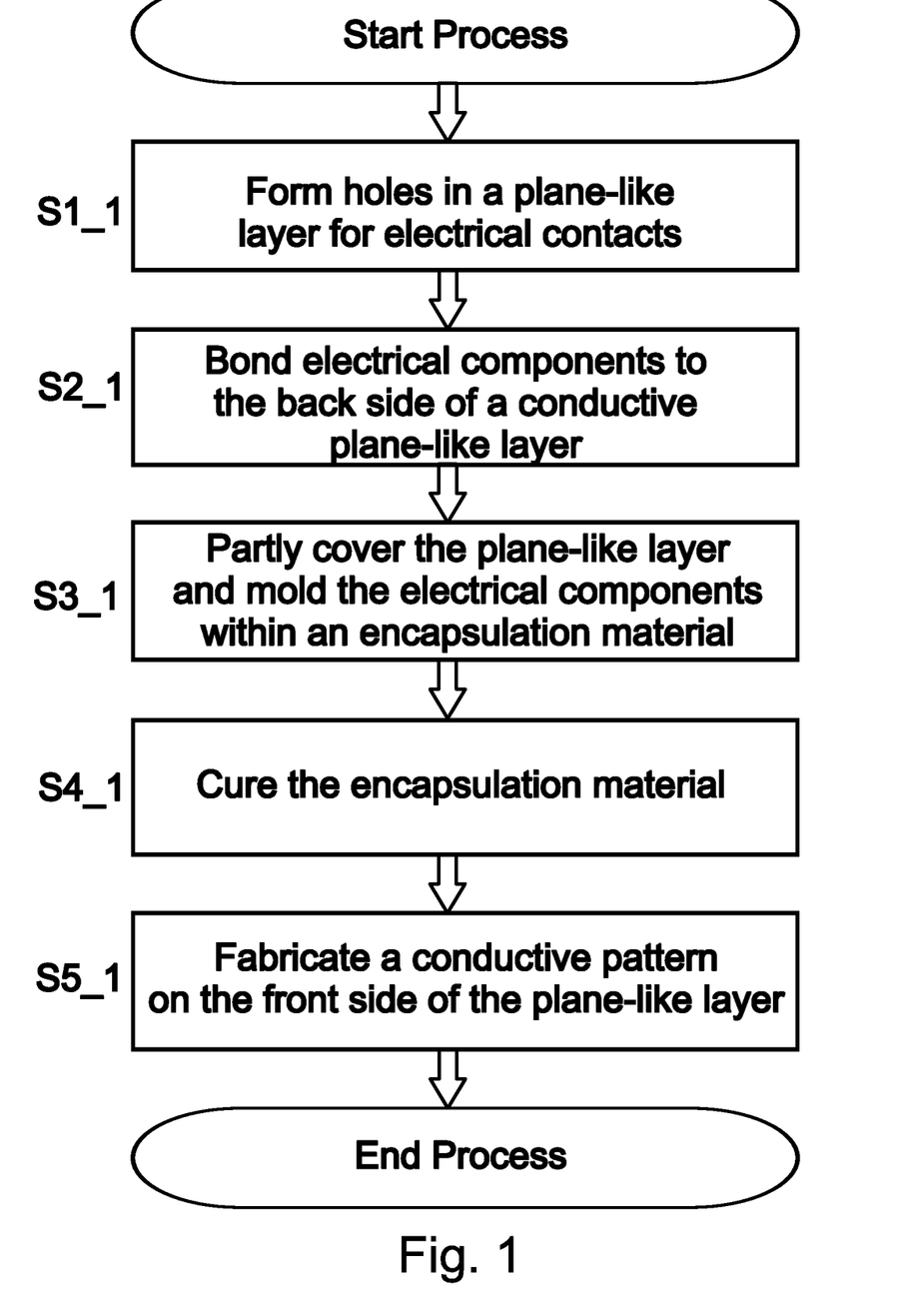
FIG. 1 shows a flow chart of an embodiment of the method in accordance with the invention.
Figure 2:
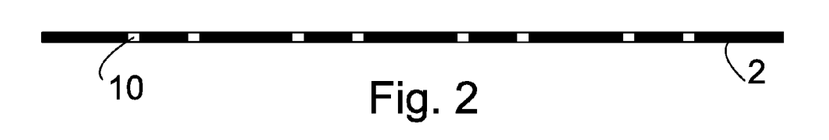
FIGS. 2 to 6 show a series of views schematically presenting the method in accordance with the flow chart shown in FIG. 1.
Figure 4:
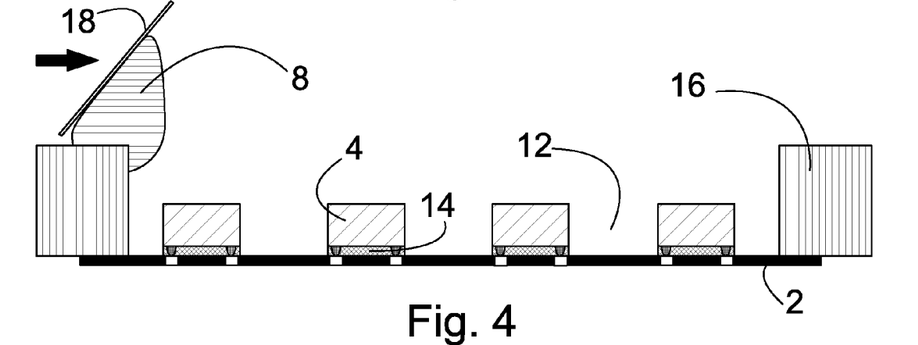
Figure 5:
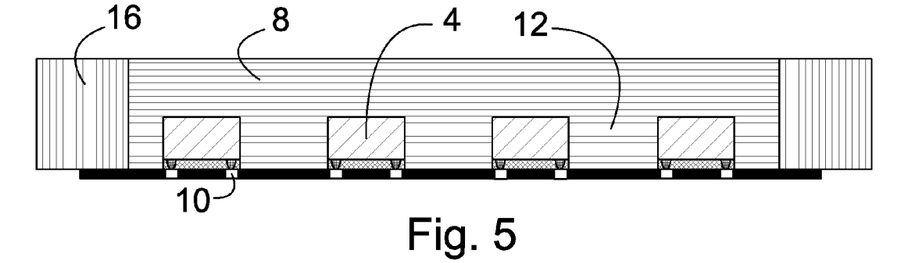
Figure 6:
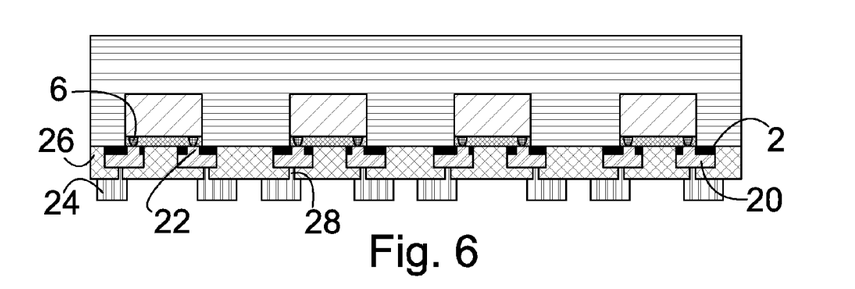

The flow chart in FIG. 1 shows an embodiment of the method in accordance with the invention. A series of views corresponding to this embodiment is shown in FIGS. 2 to 6, where each view schematically depicts a cross-section of a circuit board structure at different steps of the manufacturing method in accordance with FIG. 1. FIG. 2 shows a cross-section of the circuit board structure at the beginning of the method, and FIG. 6 shows a cross-section of the circuit board structure at the end of the method.

Figure 3:
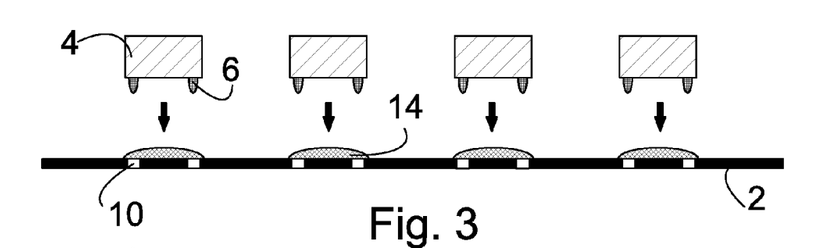

At the beginning of the method in accordance with FIG. 1, at step S1_1, holes 10 are fabricated in a plane-like layer 2, which may be copper film, for example, at the positions where the terminals 6 of electrical components 4 will be positioned, to enable an electrical contact between the electrical component 4 and a conductive pattern to be subsequently fabricated on the front side of the plane-like layer 2 (FIG. 2). At step S2_1, electrical components 4 are bonded to the back side of the plane-like layer 2 made of an electrically conductive material so that the electrical components 4 are bonded to the plane-like layer using, e.g., an adhesive binder agent 14, such as heat-curable or UV-curable epoxy (FIG. 3). Thereby, the terminals 6 of the electrical component 4 essentially become located within the adhesive binder agent 14 (FIG. 4). The holes 10 may be fabricated by laser patterning or chemical etching, for example. At step S3_1, the plane-like layer 2 is partly covered by means of masking means 16 so that, when the electrical components 4 are molded within an encapsulation material 8, the electrical components 4 and their surroundings 12 are covered by the encapsulation material 8, while certain parts on the back side of the plane-like layer 2 and the front side of the plane-like layer 2 remain free of the encapsulation material 8 (FIG. 4 and FIG. 5). The molding of the encapsulation material 8 can be realized by known molding methods, by e.g. printing, dispensing, injection molding. When the encapsulation material 8, e.g. heat-curable or UV-curable epoxy, has been suitably shaped using a mold or other shaping means 18 (FIG. 4 and FIG. 5) and cured at step S4_1, a conductive pattern is fabricated (step S5_1) on the front side of the plane-like layer 2 (FIG. 6). Detailed examples of how to fabricate the conductive pattern are presented below. The masking means 16 are also removed, and the circuit board structure can be cut to pieces of suitable sizes.

The conductive pattern may be fabricated on the surface of the plane-like layer 2 in many ways. For example, the surface of the plane-like layer may be coated with a conductive film 20. In this case, any holes 10 potentially located below the terminals 6 of the electrical components 4 will be filled with the material of the conductive film 20, thereby forming a contact area 22 between the electrical component 4 and the conductive pattern. After the coating, a first layer of the conductive pattern may be fabricated by patterning the conductive film 20 fabricated on top of the plane-like layer 2. If the plane-like layer 2 is electrically conductive (the method in accordance with FIG. 1), the patterning is also performed on the plane-like layer 2. In the case of an electrically insulating plane-like layer 2, patterning of the plane-like layer 2 is not necessary. The patterning of the plane-like layer 2 may be performed, for example, by using the same light exposure mask for both the plane-like layer 2 and the conductive film 20 during a lithography step. The conductive film 20 may be fabricated over the entire surface of a conductive plane-like layer 2, e.g., by electroless plating, electrolytic deposition, or using conventional thin-film manufacturing methods, such as CVD or PECVD.

The patterning of the plane-like layer 2 and the conductive film 20 may be performed using, e.g., chemical etching after a lithography step, laser patterning, or pattern plating. Furthermore, the surfaces of the contact areas 22 (the surfaces of the holes 10) may be cleaned, e.g., by means of laser treatment and/or chemical treatment before the fabrication of the conductive film 20. It is also possible to fabricate a thin film of another material (e.g. palladium) on these surfaces, which enables, e.g., reducing the contact resistance between the terminal 6 and the contact area 22, improving the stability of the electrical contact, and improving the adhesion of the contact area 22.

The routing ability of the conductive pattern fabricated on the surface of the plane-like layer 2 may be improved by fabricating new wiring layers on top of the wiring made of the conductive film 20 (and potentially of the conductive plane-like layer 2). A second wiring layer 24 may be fabricated, for example, by first fabricating an insulating film 26 on top of the first wiring layer, fabricating holes in the insulating film 26 at suitable positions to provide second contact areas 28 between the second wiring layer 24 and the patterned conductive film 20. These holes may be fabricated, e.g., by laser patterning or chemical etching. The insulating film 26 may be fabricated, e.g., by pressing a polymer composite layer against a manufacturing base or by using conventional thin-film manufacturing methods, such as PEVCD, CVD, or ALD.

In another embodiment of the invention, a resist layer applied on top of the conductive layer 20 in connection with the patterning of the conductive layer 20 may be used as the insulating film 26. In this case, the contact surfaces of the contact area 28 between the patterned conductive film 20, the potentially patterned plane-like layer 2, and the second wiring layer 24 are formed on walls of the patterned conductive film 20 and the potentially patterned plane-like layer 2 perpendicular to the plane of the essentially plane-like circuit board structure.

The second wiring layer 24 may be fabricated by coating the insulating film 26 with a conductive material, e.g., by electroless plating, electrolytic deposition, or using conventional thin-film manufacturing methods, such as CVD or PECVD. The conductive material, in turn, may be selectively patterned to form the wiring layer 24 by using, e.g., lithography and chemical etching, laser patterning, or pattern plating. It is also possible to clean the surfaces of the contact areas 28 as the surfaces of the holes 10, e.g., by means of laser treatment and/or chemical treatment before the fabrication of the wiring layer 24. It is also possible to fabricate a thin film of another material (e.g. palladium) on these surfaces, e.g., to improve the electrical and thermal properties of the contact areas 28.

Figure 7:
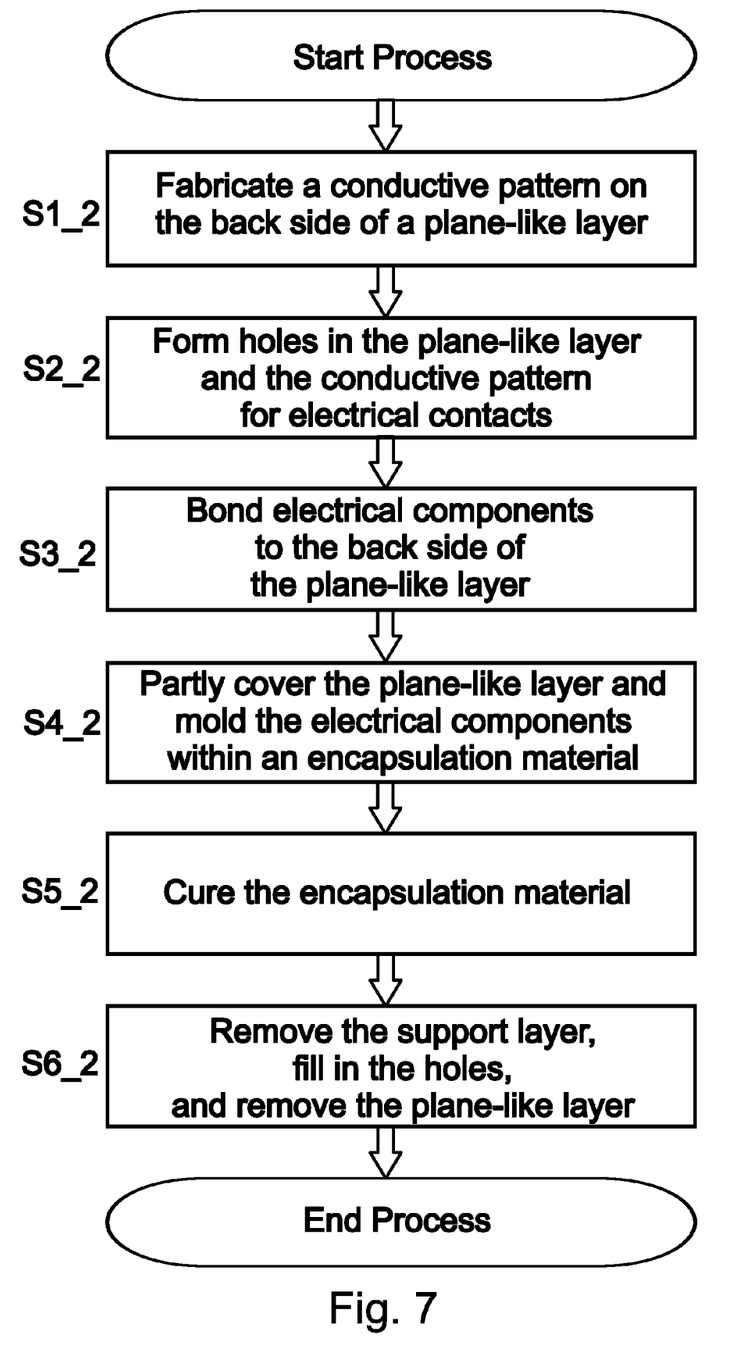
FIG. 7 shows a flow chart of an embodiment of the method in accordance with the invention.
Figure 8:
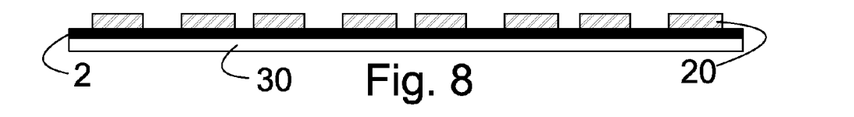
FIGS. 8 to 13 show a series of views schematically presenting the method in accordance with the flow chart shown in FIG. 7.
Figure 11:
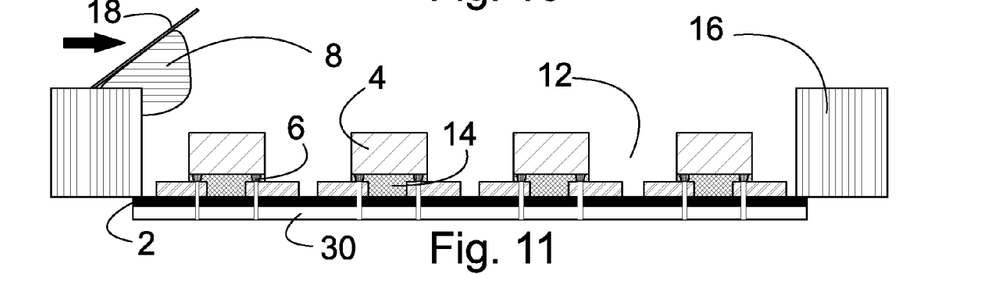
Figure 12:
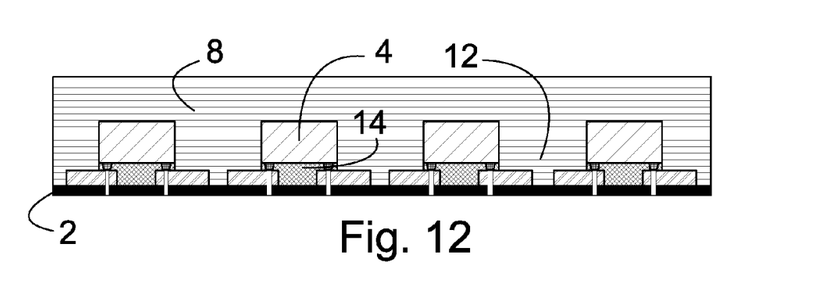
Figure 13:
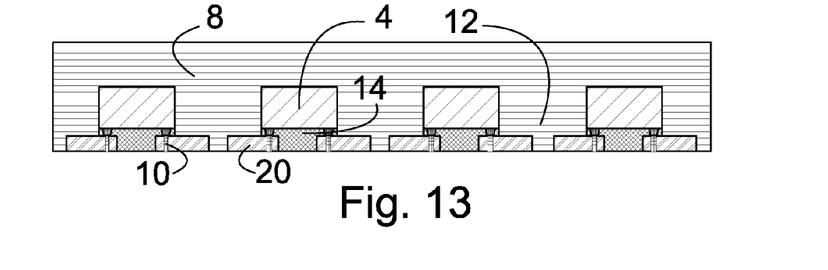

The flow chart in FIG. 7 shows an embodiment of the method in accordance with the invention. A series of views corresponding to this embodiment is shown in FIGS. 8 to 13, where each view schematically depicts a cross-section of the circuit board structure at different steps of the manufacturing method in accordance with FIG. 7. FIG. 8 shows a cross-section of the circuit board structure at the beginning of the method, and FIG. 13 shows a cross-section of the circuit board structure at the end of the method.

Figure 9:
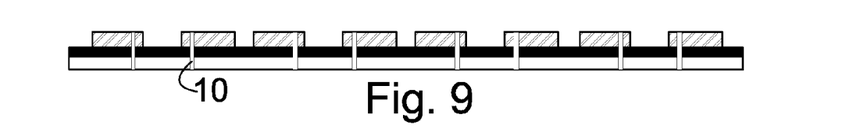
Figure 10:
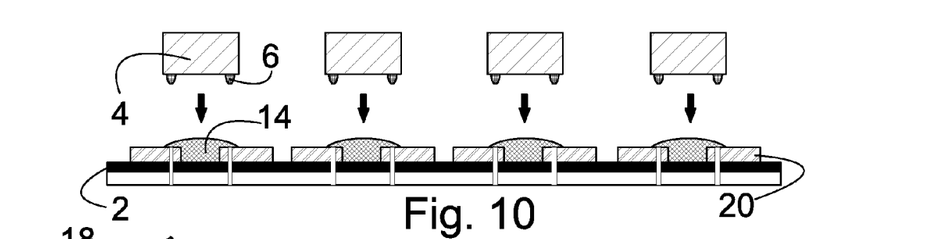

At the beginning of the method in accordance with FIG. 7, at step S1_2, a conductive pattern is fabricated on the back side of a plane-like layer 2 by patterning a conductive film 20 (FIG. 8). The conductive pattern may be fabricated, e.g., by coating a conductive film 20 on the back side of the plane-like layer 2 and patterning this film by the methods mentioned above. Alternatively, the conductive film 20 may be fabricated, for example, by coating a thinner, e.g. 3 to 10 μm thick, conductive plane-like layer 2 as a seed metal layer on top of a thicker support layer 30 (e.g., a 50 to 300 μm thick Al, Cu, or steel film). After this, the actual conductive pattern corresponding to the patterned conductive film 20 in FIGS. 8 to 13 is coated on the surface of this plane-like layer 2 serving as a seed metal layer, on the back side of the plane-like layer 2. In this embodiment, both the support layer 30 and the plane-like layer 2 may be conductive, as said layers are removed at a subsequent step of the method. The routing ability of the conductive pattern may be improved, as desired, by fabricating new wiring layers on top of the wiring made of the conductive film 20, as disclosed above. At step S2_2, holes 10 are fabricated through the plane-like layer 2, the patterned conductive film 20, and potentially the support layer 30 located on the front side (below) the plane-like layer 2, on the surface of the plane-like layer 2 (FIG. 9). It is not necessary for the holes 10 to extend through the support layer 30, as the support layer 30 is removed at a subsequent step of the method, typically before the filling in of the holes 10. In this case, it is sufficient to form the holes through the plane-like layer 2, which potentially served as a seed metal layer, and through the conductive pattern (or the patterned conductive film 20 equal to the conductive pattern). The holes 10 are fabricated at positions where terminals 6 of electrical components 4 to be attached to the conductive pattern become positioned when the components are attached to the structure at step S3_2 (FIG. 10) to form a good and reliable electrical contact between the electrical component bonded to the conductive pattern and the conductive pattern made of the patterned conductive film 20. The holes 10 may be fabricated, for example, by laser patterning or chemical etching. At step S3_2, electrical components 4 are bonded to the patterned conductive film 20 fabricated on the back side of the plane-like layer 2 so that the electrical components 4 are bonded to the patterned conductive film 20 by means of, e.g., an adhesive binder agent 14, such as a heat-curable or UV-curable epoxy (FIG. 10). Thereby, the terminals 6 of the electrical component 4 essentially become located within the adhesive binder agent 14 (FIG. 11). At step S4_2, the plane-like layer 2 is partly covered using masking means 16, so that when the electrical components 4 are molded within the encapsulation material 8, the electrical components 4 and their surroundings 12, and partly also the conductive pattern (e.g. the patterned conductive film 20), are covered by the encapsulation material 8, while selective parts on the back side of the plane-like layer 2 and the front side of the plane-like layer 2 remain free of the encapsulation material 8 (FIG. 11 and FIG. 12). The molding of the encapsulation material 8 can be realized by known molding methods, by e.g. printing, dispensing, injection molding. When the encapsulation material 8, e.g. a heat-curable or UV-curable epoxy, has been suitably shaped by means of, e.g., a mold or other shaping means 18 (FIG. 11 and FIG. 12) and cured at step S5_2, the support layer 30 is removed from the front side of the plane-like layer 2, after which the holes 10 are filled with contact material, e.g. by coating, and the plane-like layer 2 is removed from below the structure (step S6_2). Typically, the removal of the support layer 30, the filling in of the holes 10, and the removal of the plane-like layer 2 are performed in the order stated. This enables forming a good electrical contact between the electrical component 4 and the conductive pattern (e.g., the patterned conductive film 20) in a simple fashion (FIG. 13). The masking means 16 are also removed, and the circuit board structure can be cut into pieces of suitable sizes.

Figure 14:
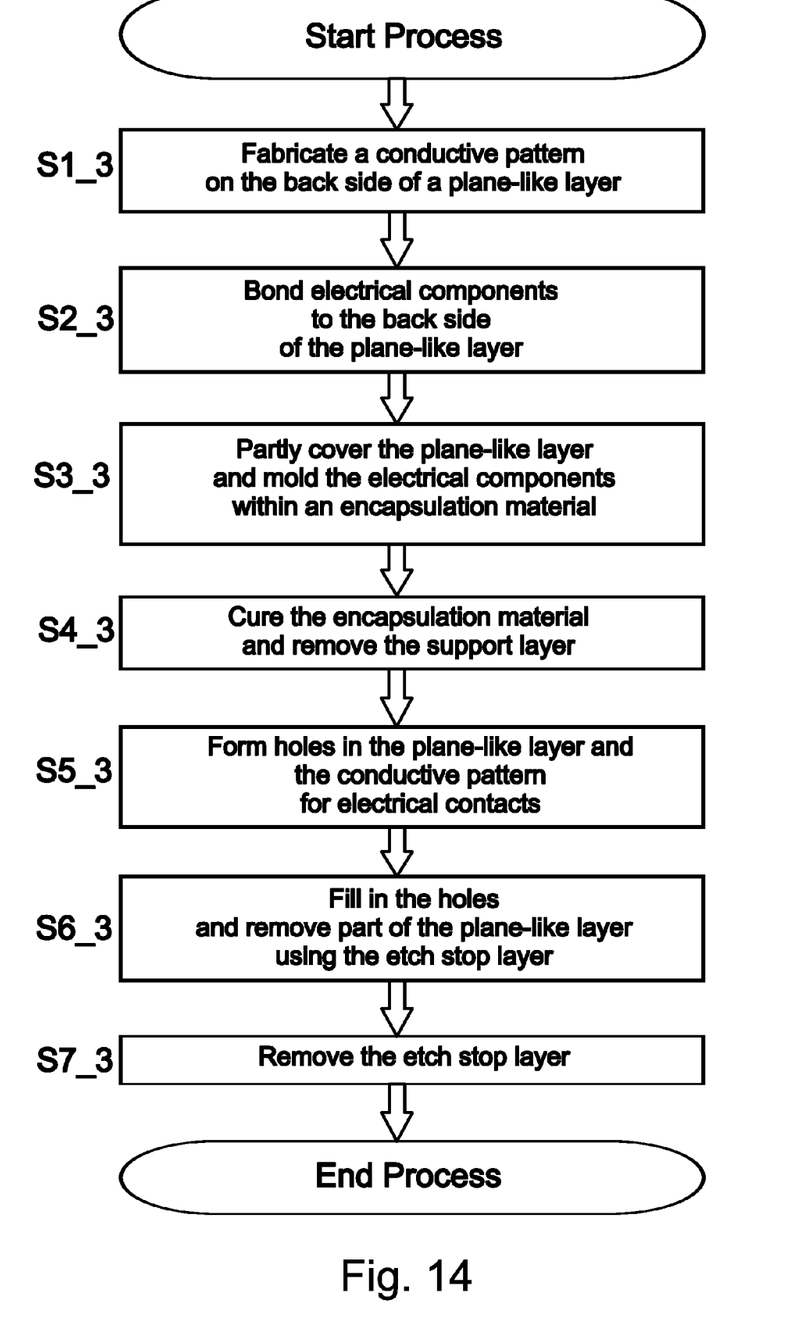
FIG. 14 shows a flow chart of an embodiment of the method in accordance with the invention.
Figure 15:
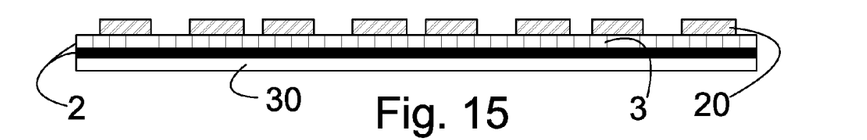
FIGS. 15 to 19 show a series of views schematically presenting the method in accordance with the flow chart shown in FIG. 14.
Figure 17:
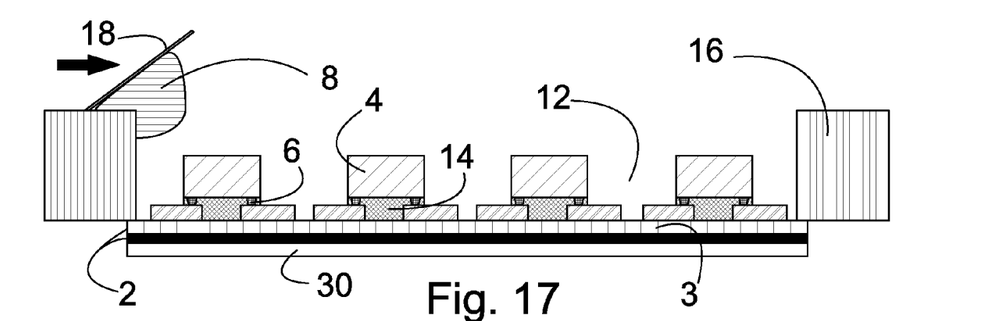
Figure 18:
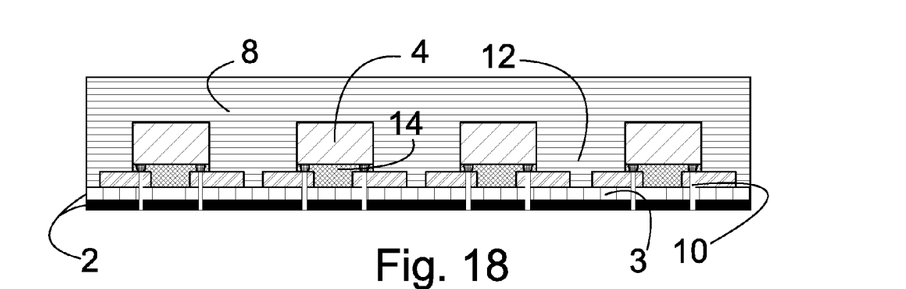
Figure 19:
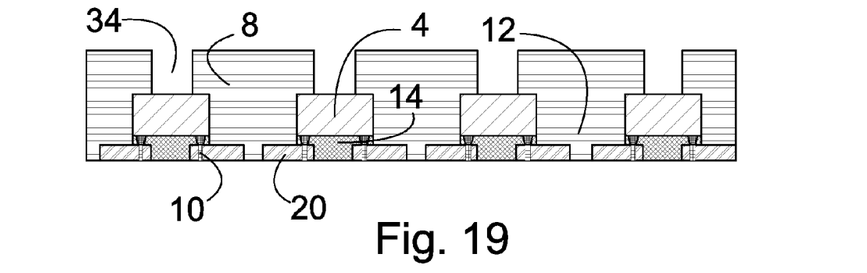

The flow chart in FIG. 14 shows an embodiment of the method in accordance with the invention. A series of views corresponding to this embodiment is shown in FIGS. 15 to 19, where each view schematically depicts a cross-section of the circuit board structure at different steps of the manufacturing method in accordance with FIG. 14. FIG. 15 shows a cross-section of the circuit board structure at the beginning of the method, and FIG. 19 shows a cross-section of the circuit board structure at the end of the method.

Figure 16:
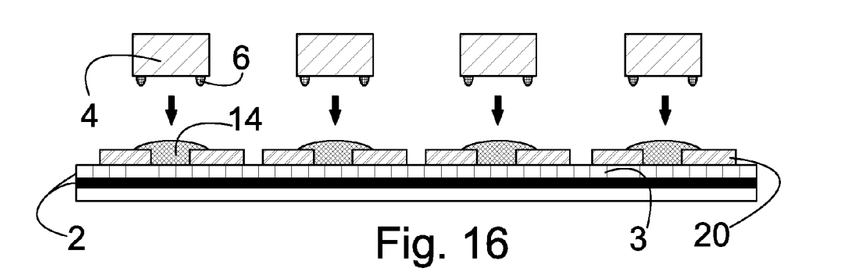

At the beginning of the method in accordance with FIG. 14, at step S1_3, a conductive pattern is fabricated on the back side of the plane-like layer 2 by patterning a conductive film 20 (FIG. 15). The plane-like layer 2 comprises, in this embodiment of the invention, an etch-stop layer 3 on the back side surface of the plane-like layer 2 which is supported by a thicker support layer 30. The conductive pattern may be fabricated, e.g., by coating the conductive film 20 on the back side of the plane-like layer 2, on the etch stop layer 3, and patterning this film using the methods mentioned above. In this embodiment, the support layer 30 and the plane-like layer 2 may be conductive as the support layer 30 and the plane-like layer 2 are removed at subsequent steps of the method. The routing ability of the conductive pattern may be improved, as desired, by fabricating new wiring layers on top of the wiring made of the conductive film 20, as disclosed above. At step S2_3, electrical components 4 are bonded to the patterned conductive film 20 fabricated on the back side of the plane-like layer 2 so that the electrical components 4 are bonded to the patterned conductive film 20 by means of, e.g., an adhesive binder agent 14, such as a heat-curable or UV-curable epoxy (FIG. 16). Thereby, terminals 6 of the electrical component 4 essentially become located within the adhesive binder agent 14 (FIG. 17). At step S3_3, the plane-like layer 2 is partly covered using masking means 16, so that when the electrical components are molded within the encapsulation material 8, the electrical components 4 and their surroundings 12, and partly also the conductive pattern (e.g. the patterned conductive film 20), are covered by the encapsulation material 8, while selective parts on the back side of the plane-like layer 2 and the front side of the plane-like layer 2 remain free of the encapsulation material 8 (FIG. 17 and FIG. 18). The molding of the encapsulation material 8 can be realized by known molding methods, by e.g. printing, dispensing, injection molding. When the encapsulation material 8, e.g. a heat-curable or UV-curable epoxy, has been suitably shaped by means of, e.g., a mold or other shaping means 18 (FIG. 17 and FIG. 18) and cured at step S4_3, the support layer 30 is removed from the front side of the plane-like layer 2. At step S5_3 holes 10 are formed through the plane-like layer 2 and the patterned conductive film 20 (the conductive pattern) (FIG. 18). In some other embodiments of the invention holes 10 are also formed through the support layer 30 located on the front side (below) the plane-like layer 2 on the surface of the plane-like layer 2. It is however not necessary for the holes 10 to extend through the support layer 30, if the support layer 30 is removed before forming the holes 10. In this embodiment, it is sufficient to form the holes through the plane-like layer 2, and through the conductive pattern. The holes 10 are fabricated at positions where the terminals 6 of the electrical components 4 attached to the conductive pattern have become located when the components were attached to the structure at step S2_3 (FIG. 16) to form a good and reliable electrical contact between the electrical component 4 bonded to the conductive pattern and the conductive pattern comprising the patterned conductive film 20. The holes 10 may be fabricated, e.g., by laser patterning or chemical etching. After this, the holes 10 are filled with contact material, e.g. by coating, and part of the plane-like layer 2 excluding the etch stop layer 3 is removed from the structure using the etch stop layer 3 (step S6_3). In one embodiment of the invention the plane-like layer 2 comprises a Cu foil under the etch stop layer 3 which may be of e.g. Sn. Typically, the removal of the support layer 30, the filling in of the holes 10, and the removal of part of the plane-like layer 2 are performed in the order stated. This enables forming a good electrical contact between the electrical component 4 and the conductive pattern (e.g. the patterned conductive film 20) in a simple manner (FIG. 19). The etch stop layer 3 in this embodiment of the invention facilitates removal of the support layer 30 and part of the plane-like layer 2 (e.g. the Cu foil). The etch stop layer 3 protects the conductive pattern and the electrical contacts between the conductive pattern and the terminals 6 during the removal process. This further improves reliability of the method and of the electrical contacts under the terminals 6. The support layer 30 and the part of the plane-like layer 2 (e.g. the Cu foil) excluding the etch stop layer 3 can be removed by e.g. chemical etching and a suitable material for the etch stop layer 3 depends on the etching reagent used. An example of a material which can be used for the etch stop layer 3 on a Cu foil is Sn but other suitable materials will be obvious for a skilled person in light of this specification. In step S7_3 the etch stop layer 3 is removed to produce the circuit board structure of FIG. 19. Use of a conductive etch stop layer 3, such as an Sn etch stop layer, is justified by the fact that the etch stop layer 3 can be removed using processes, e.g. chemical reagents, which do not significantly affect the underlying conductive pattern or the electrical contacts under the terminals 6 of the electrical components 4. A resistive etch stop layer 3 may also be conceived in some other embodiments of the invention in which case the etch stop layer 3 can be left in contact with the conductive pattern and does not necessarily have to be removed at all from the final structure. At the end of the method of FIG. 14 the masking means 16 are also removed and the circuit board structure can be cut into pieces of suitable sizes. In the structure of FIG. 19 the cured encapsulation material 8 has been selectively removed to form apertures 34 on the electrical components 4. These apertures 34 are used to enable efficient connection of the encapsulated (in this case partially encapsulated) electrical component 4 with the environment, or to enhance cooling of the component. Apertures 34 are advantageous e.g. when packaging components whose operation requires a connection with the environment, e.g. sensor devices, MEMS components, solar cells, or light-emitting devices such as LEDs.

Figure 20:
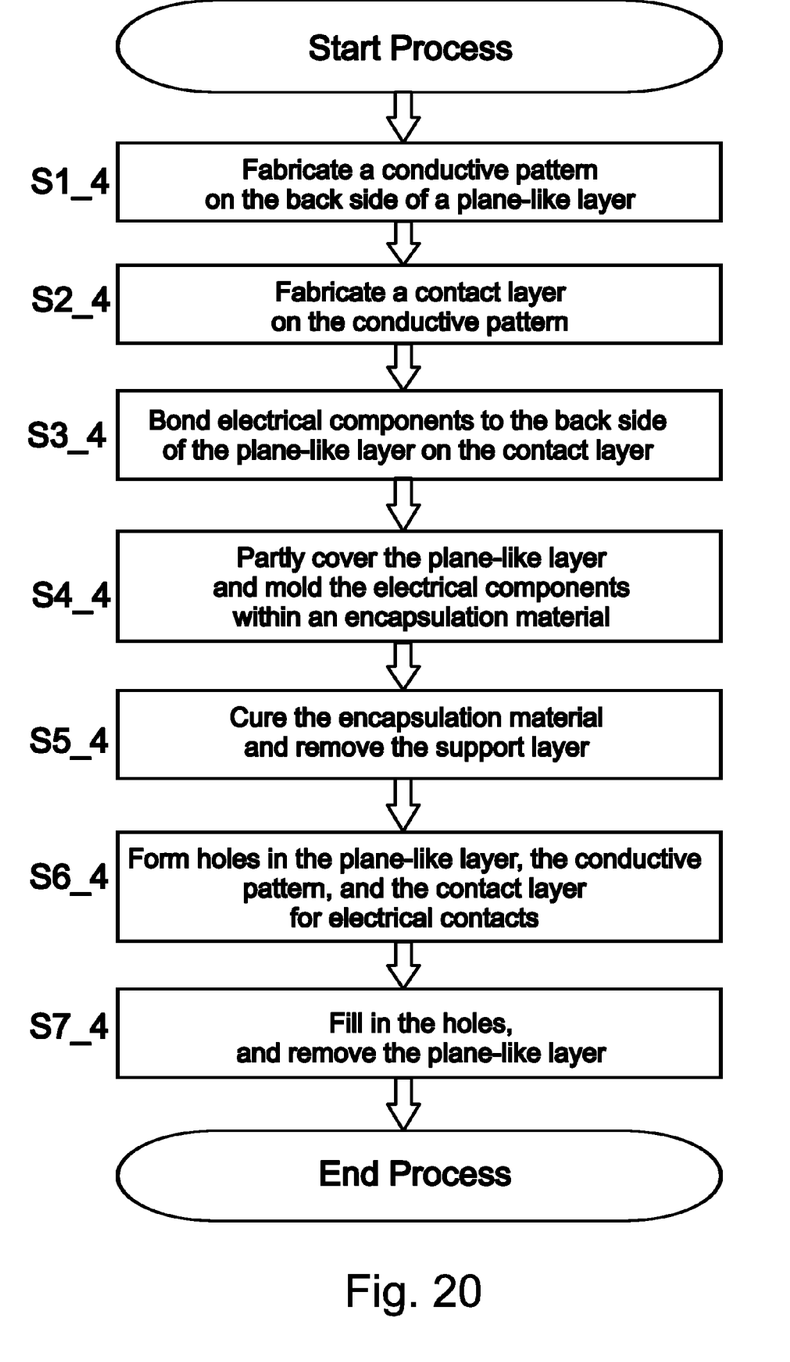
FIG. 20 shows a flow chart of an embodiment of the method in accordance with the invention.
Figure 21:
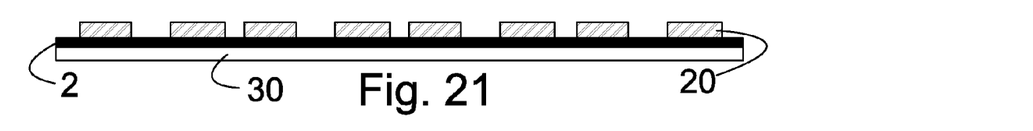
FIGS. 21 to 26 show a series of views schematically presenting the method in accordance with the flow chart shown in FIG. 20.
Figure 24:
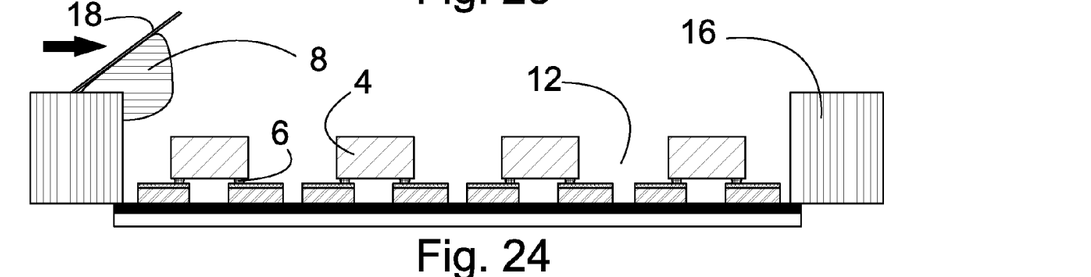
Figure 25:
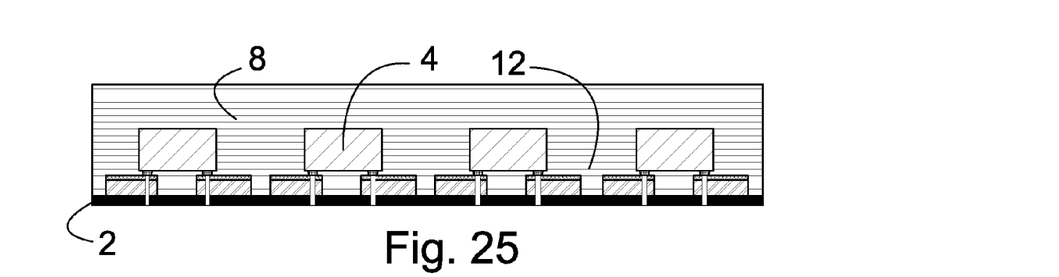
Figure 26:
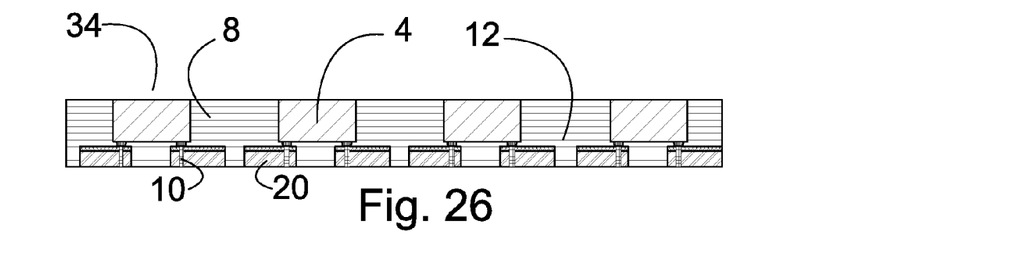

The flow chart in FIG. 20 shows an embodiment of the method in accordance with the invention. A series of views corresponding to this embodiment is shown in FIGS. 21 to 26, where each view schematically depicts a cross-section of the circuit board structure at different steps of the manufacturing method in accordance with FIG. 20. FIG. 21 shows a cross-section of the circuit board structure at the beginning of the method, and FIG. 26 shows a cross-section of the circuit board structure at the end of the method.

Figure 22:
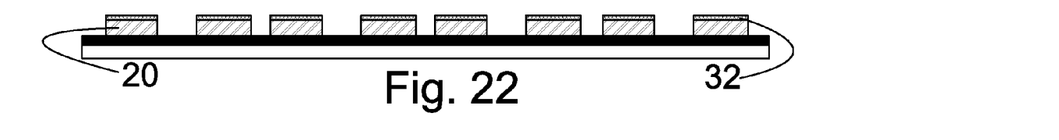
Figure 23:
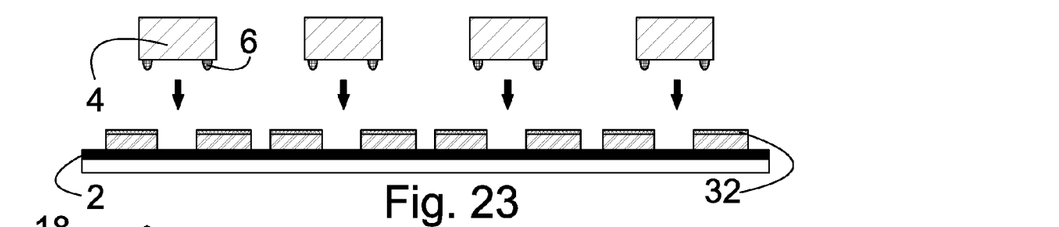

At the beginning of the method in accordance with FIG. 20, at step S1_4, a conductive pattern is fabricated on the back side of the plane-like layer 2 by patterning a conductive film 20 (FIG. 21). The conductive pattern may be fabricated, e.g., by coating the conductive film 20 on the back side of the plane-like layer 2 and patterning this film using the methods mentioned above. Alternatively, the conductive pattern may be fabricated, for example, by coating a thinner, e.g. 3 to 10 μm thick, conductive plane-like layer 2 as a seed metal layer on top of a thicker support layer 30 (e.g., a 18 to 300 μm thick Al, Cu, or steel film). After this, the actual conductive pattern corresponding to the patterned conductive film 20 in FIGS. 21 to 26 is coated on the surface of this plane-like layer 2 serving as a seed metal layer, on the back side of the plane-like layer 2. In this embodiment, both the support layer 30 and the plane-like layer 2 may be conductive, as said layers are removed at a subsequent step of the method. The routing ability of the conductive pattern may be improved, as desired, by fabricating new wiring layers on top of the wiring made of the conductive film 20, as disclosed above. At step S2_4 a contact layer 32 is selectively formed on the conductive pattern (FIG. 22). This can be accomplished by standard techniques, e.g. employing thin-film deposition, lithography and chemical etching. The purpose of the contact layer 32 is to facilitate bonding of the electrical components 4 on the circuit board structure with good electrical connection to the conductive pattern, even without using the adhesive binder agent 14 utilized in the other exemplary embodiments discussed previously. Therefore the contact layer 32 could, in other embodiments of the invention, be patterned even so that only small areas around the locations where the terminals 6 of the electrical components 4 will be placed are covered by the contact layer 32. The contact layer 32 is fabricated from a material with good electrical conductivity, e.g. Au or Sn. If the material of the contact layer 32 is suitably selected, such that it is e.g. of the same material as the terminals 6, the contact layer 32 enables metallurgic contacting of the electrical component 4 on the contact layer 32. This results in good adhesion of the electrical components 4 on the circuit board structures even without the additional adhesive binder agent 14. In step S3_4 electrical components 4 are bonded to the contact layer 32 fabricated on the back side of the plane-like layer 2 on the patterned conductive film 20 (FIG. 23) so that the terminals 6 of the electrical components are positioned against the contact layer 32. In practice a good adhesion and the metallurgic contact between a terminal 6 and the contact layer 32 can be achieved using e.g. thermo-compression or ultrasonic welding. At step S4_4, the plane-like layer 2 is partly covered using masking means 16, so that when the electrical components 4 are molded within the encapsulation material 8, the electrical components 4 and their surroundings 12, and partly also the conductive pattern (e.g. the patterned conductive film 20), are covered by the encapsulation material 8, while selective parts on the back side of the plane-like layer 2 and the front side of the plane-like layer 2 remain free of the encapsulation material 8 (FIG. 24 and FIG. 25). The encapsulation material 8 in this embodiment of the invention also serves as an underfilling material for the electrical components 4 as it flows under the electrical components 4 during the molding process. This also encapsulates the terminals 6. The molding of the encapsulation material 8 can be realized by known molding methods, by e.g. printing, dispensing, injection molding. When the encapsulation material 8, e.g. a heat-curable or UV-curable epoxy, has been suitably shaped by means of, e.g., a mold or other shaping means 18 (FIG. 24 and FIG. 25) and cured at step S5_4, the support layer 30 is removed from the front side of the plane-like layer 2. At step S6_4, holes 10 are formed through the plane-like layer 2, the patterned conductive film 20 and the contact layer 32 (FIG. 25). In some other embodiments of the invention holes 10 are also formed through the support layer 30 located on the front side (below) the plane-like layer 2 on the surface of the plane-like layer 2. It is however not necessary for the holes 10 to extend through the support layer 30, if the support layer 30 is removed before forming the holes 10. In this embodiment, it is sufficient to form the holes through the plane-like layer 2, which potentially served as a seed metal layer, through the conductive pattern (or the patterned conductive film 20 equal to the conductive pattern), and through the contact layer 32. The holes 10 are fabricated at positions where the terminals 6 of the electrical components 4 attached to the conductive pattern have become located when the components were attached to the structure at step S3_4 (FIG. 23) to form a good and reliable electrical contact between the electrical component 4 bonded to the contact layer 32 and the conductive pattern comprising the patterned conductive film 20. The holes 10 may be fabricated, e.g., by laser patterning or chemical etching. After this, the holes 10 are filled with electrically conductive contact material, e.g. by coating, and the plane-like layer 2 is removed from below the structure (step S7_4). In some embodiments of the invention, the removal of the support layer 30, the filling in of the holes 10, and the removal of the plane-like layer 2 are performed in the order stated. This enables forming a good electrical contact between the electrical component 4 and the conductive pattern (e.g. the patterned conductive film 20) in a simple manner (FIG. 26). The masking means 16 are also removed, and the circuit board structure can be cut into pieces of suitable sizes. In the structure of FIG. 26 the cured encapsulation material 8 has been selectively removed to form apertures 34 on the electrical components 4. These apertures 34 are used to enable efficient connection of the encapsulated (in this case partially encapsulated) electrical component 4 with the environment, or to enhance cooling of the component. Apertures 34 are advantageous e.g. when packaging components whose operation requires a connection with the environment, e.g. sensor devices, MEMS components, solar cells, or light-emitting devices such as LEDs.

In other embodiments of the invention, a conductive pattern may be fabricated on the surface of a plane-like layer 2 by various ways other than those presented above. Detailed descriptions of these methods are available, e.g., in patent application publications WO 2006/134216, WO 2006/134217, and WO 2006/134220, which are incorporated herein as reference publications.

In some embodiments of the invention the circuit board structures, as provided by the embodiments of the invention disclosed above, can be electrically connected to each other in the direction perpendicular to the direction of the plane of the circuit board. In this way the circuit board structures can be utilized to integrate components in this vertical direction, in order to fabricate more versatile electrical circuits in three dimensions.

The invention claimed is:

1. A method for manufacturing a circuit board structure comprising at least one electrical component, comprising the steps of fabricating a conductive pattern on the surface of an essentially plane-like layer on the back side of the plane-like layer, and forming an electrical contact between the at least one electrical component and the conductive pattern, wherein the method comprises the steps of:

attaching the at least one electrical component on the back side of the plane-like layer after the fabrication of the conductive pattern so that terminals below the at least one electrical component become positioned against the conductive pattern fabricated on the back side of the plane-like layer, molding encapsulation material on the back side of the plane-like layer so that the encapsulation material at least partly encloses the at least one electrical component attached to the back side of the plane-like layer and that the front side of the plane-like layer remains free of the encapsulation material at least at positions where the at least one electrical component is attached to the plane-like layer on the back side of the plane-like layer, and forming holes through the conductive pattern at positions where the terminals of the at least one electrical component is attached to the back side of the plane-like layer and become positioned when the at least one electrical component is attached to the circuit board structure in order to form a conduit from the terminal through the conductive pattern.

2. A method as claimed in claim 1, wherein the holes are formed through the plane-like layer and the conductive pattern before the at least one electrical component is attached to the back side of the plane-like layer after the fabrication of the conductive pattern, in order to form a conduit from the front side of the plane-like layer to the back side of the plane-like layer.

3. A method as claimed in claim 1, wherein the methods comprises the step of partly covering the plane-like layer so that, as viewed from the back side of the plane-like layer, only those areas where an electrical component is attached and their surroundings can be exposed to the encapsulation material so that the encapsulation material cannot come into contact with the front side of the plane-like layer when the encapsulation material is molded on the back side of the plane-like layer to enclose the at least one electrical component within the encapsulation material.

4. A method as claimed in claim 1, wherein the method comprises the step of applying a binder agent to the back side of the plane-like layer so that the terminals below the electrical component essentially become located within the binder agent when the electrical component is attached to the circuit board structure.

5. A method as claimed in claim 1, wherein the plane-like layer comprises an etch stop layer for protecting the conductive pattern.

* * * * *